US005276962A

United States Patent [19]

Harting et al.

[11] Patent Number: 5,276,962

[45] Date of Patent: Jan. 11, 1994

[54] METHOD AND APPARATUS FOR PRESSING CONTACT ELEMENTS OF MULTIPOLAR PLUG-IN CONNECTORS INTO PRINTED CIRCUIT BOARD

[75] Inventors: Dietmar Harting, Espelkamp; Hartmuth Schmidt, Osterkappeln; Karl Wärmker, Pr. Oldendorf-Getmold, all of Fed. Rep. of Germany

[73] Assignee: Harting Elektronick GmbH, Espelkamp, Fed. Rep. of Germany

[21] Appl. No.: 969,633

[22] Filed: Oct. 30, 1992

[30] Foreign Application Priority Data

Nov. 8, 1991 [DE] Fed. Rep. of Germany ....... 4136853

[51] Int. Cl.[5] ........................ H05K 3/30; B23P 19/00

[52] U.S. Cl. ...................................... 29/837; 29/739; 29/845

[58] Field of Search ......................... 29/837, 845, 739

[56] References Cited

U.S. PATENT DOCUMENTS

| | | | |
|---|---|---|---|
| 3,676,926 | 7/1972 | Kendall | 29/739 X |
| 3,924,325 | 12/1975 | Kufner . | |
| 4,089,104 | 5/1978 | Barry et al. . | |
| 4,089,581 | 5/1978 | Schwindt . | |
| 4,451,975 | 6/1984 | Baccei | 29/739 X |
| 4,467,523 | 8/1984 | Chisholmm | 29/845 |
| 4,503,610 | 3/1985 | Resch | 29/845 |
| 5,142,777 | 9/1992 | Boyer et al. | 29/739 X |

FOREIGN PATENT DOCUMENTS

| | | | |
|---|---|---|---|
| 3810975 | 10/1989 | Fed. Rep. of Germany | 29/845 |

*Primary Examiner*—Carl J. Arbes
*Attorney, Agent, or Firm*—Jordan and Hamburg

[57] ABSTRACT

For pressing the contact elements of multipolar plug-in connectors into boreholes on printed circuit boards, the contact elements are pressed-in in several steps, so that only some contact elements are pressed in during each step, while the remaining contact elements are pressed-in in other steps, such that the pressing-in force does not become excessively large and can be performed with conventional presses.

19 Claims, 4 Drawing Sheets

METHOD AND APPARATUS FOR PRESSING CONTACT ELEMENTS OF MULTIPOLAR PLUG-IN CONNECTORS INTO PRINTED CIRCUIT BOARD

BACKGROUND OF THE INVENTION

1. Field of the Invention

The present invention relates to a method for pressing press-fit sections of contact elements of multipolar plug-in connectors into boreholes of a printed circuit board, as well as a tool for carrying out this method.

Specifically, the present invention is directed to such a method in which the contact elements are disposed in rows and columns in a carrier of insulating material, with the contact elements being held initially in recesses in the insulator by means of frictional resistance. The contact elements are pressed by means of a comb-like tool into the boreholes of the printed circuit board, and the pressing-in force of the tool is transferred by appropriate shoulders on the tool which engage shoulders on the contact elements.

2. Description of the Related Art

The pressing of the contact elements of a multipolar plug-in connector by a comb-like tool into the boreholes of a printed circuit board is well known. Such a tool has recesses for temporarily accommodating the upper ends of the contact elements, as well as shoulder-like stops, which interact with corresponding shoulders on the contact elements and transfer the pressing-in force.

The force which must be applied to press in the tool is determined by the number of press-fit sections of the contact elements which must be pressed in simultaneously and assumes considerable values as the number of contact elements increases. For example, when pressing in known 96-pole plug-in connectors, forces of the order of 5,000 to 10,000N have to be applied.

Recent developments have been in the direction of providing plug-in connector strips with up to 500 contact elements. The force which must be applied to simultaneously press in the contact elements is of the order of 25,000 to 75,000N. If at all, such forces can be applied for the installation of plug-in connector strips only with enormously large presses and not with presses available for the installation of plug-in connector strips.

SUMMARY OF THE INVENTION

It is thus an object of the invention to provide a method for pressing contact elements of multipolar plug-in connectors into printed circuit boards, in which the forces to be applied are reduced.

It is another object of the invention to provide a method for pressing contact elements of multipolar plug-in connectors into printed circuit boards, which can be used easily and economically.

This objective is accomplished by pressing the contact elements into the boreholes of the printed circuit board in at least two steps. In the first step, the pressing-in force is exerted only on a first set of the contact elements and these are pressed into boreholes in the printed circuit board. In the first step, the carrier of the plug-in connector is pressed against the surface of the printed circuit board. Further, the contact elements which are not acted upon by the pressing-in force, move only slightly with their press-fit section into the upper regions of the printed circuit board boreholes and are subsequently pushed upwards into the recesses of the insulator. In a second or optionally subsequent step, the pressing-in force being exerted on the remaining contact elements which have been pushed up, or optionally on a portion of these remaining contact elements, which have been pushed up, is such that these contact elements are pushed back into the recesses of the insulator and their press-fit sections at the same time are pressed into the boreholes of the printed circuit board.

A further object of the invention is to provide as simple a tool as possible for implementing the above method.

This objective is accomplished by a tool having recesses corresponding to those positions in which contact elements that are not to be pressed in during the pressing-in stroke, the recesses receiving the holding regions of these contact elements that are not pressed in during the pressing-in process.

The advantages achieved with the invention include, in particular, that only relatively low force need be applied on the tool in each pressing-in step, that is, a force which can be applied with normal hand lever presses or pneumatic presses, since only some of the contact elements are pressed into the boreholes in two, or optionally more, steps.

The tool required for this method is easily handled. The remaining contact elements which were not pressed in by the first stroke of the press, are now pressed in simply by shifting or moving the tool sideways for the second stroke. Alternatively, a tool which is rotatably mounted on a support is particularly easy to handle for a shifting operation. In such case, after the first stroke of the tool, the latter is simply swivelled through 180° and the second stroke for pressing in the remaining contact elements is then carried out.

BRIEF DESCRIPTION OF THE DRAWINGS

Embodiments of the invention are described in greater detail in the following description which is illustrated in the drawing, in which.

DETAILED DESCRIPTION OF THE PREFERRED EMBODIMENTS

Figure 1:
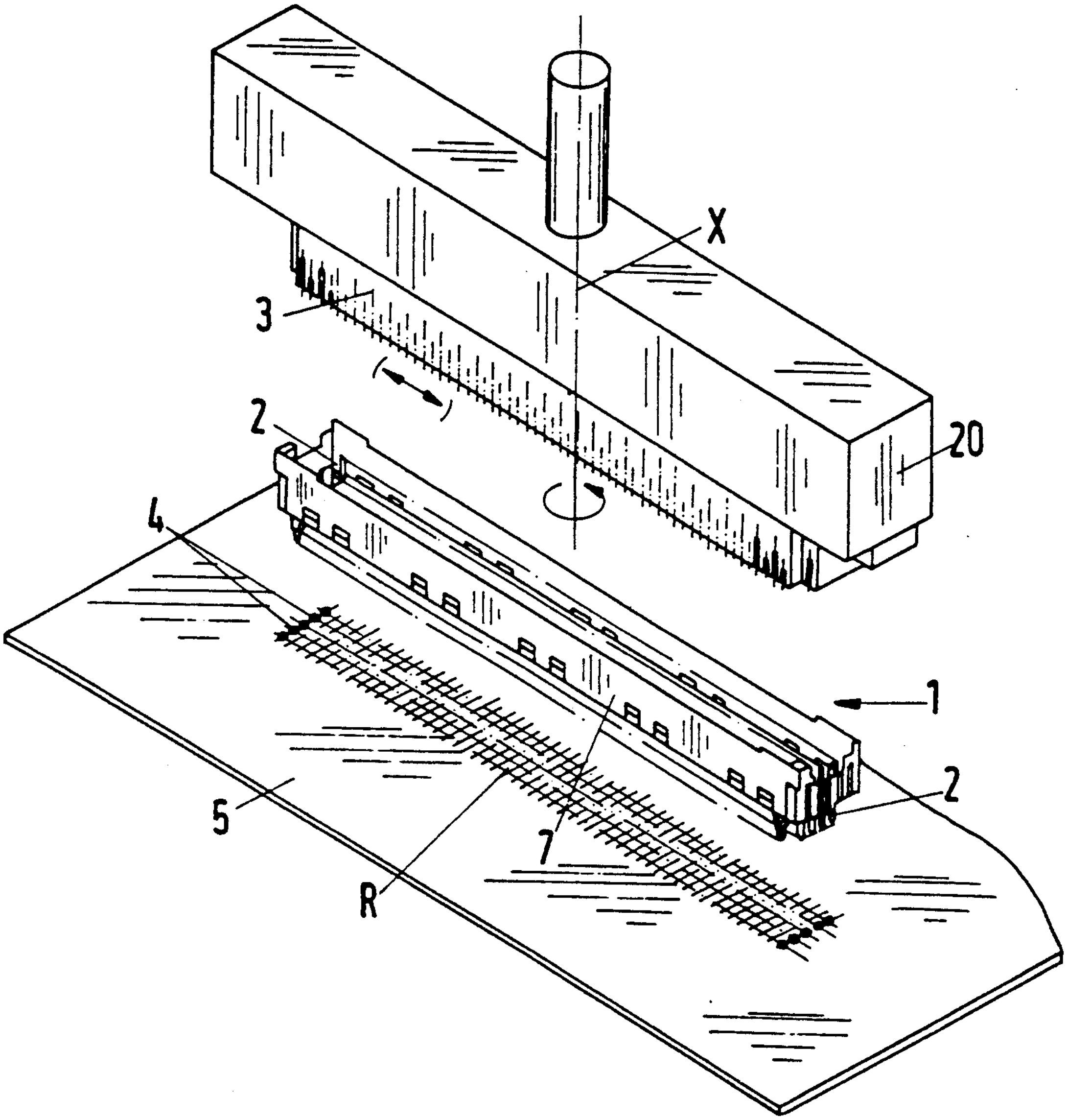
FIG. 1 is a perspective view of a tool according to a first embodiment of the present invention, shown in connection with a plug-in connector and a printed circuit board.
Figure 2:
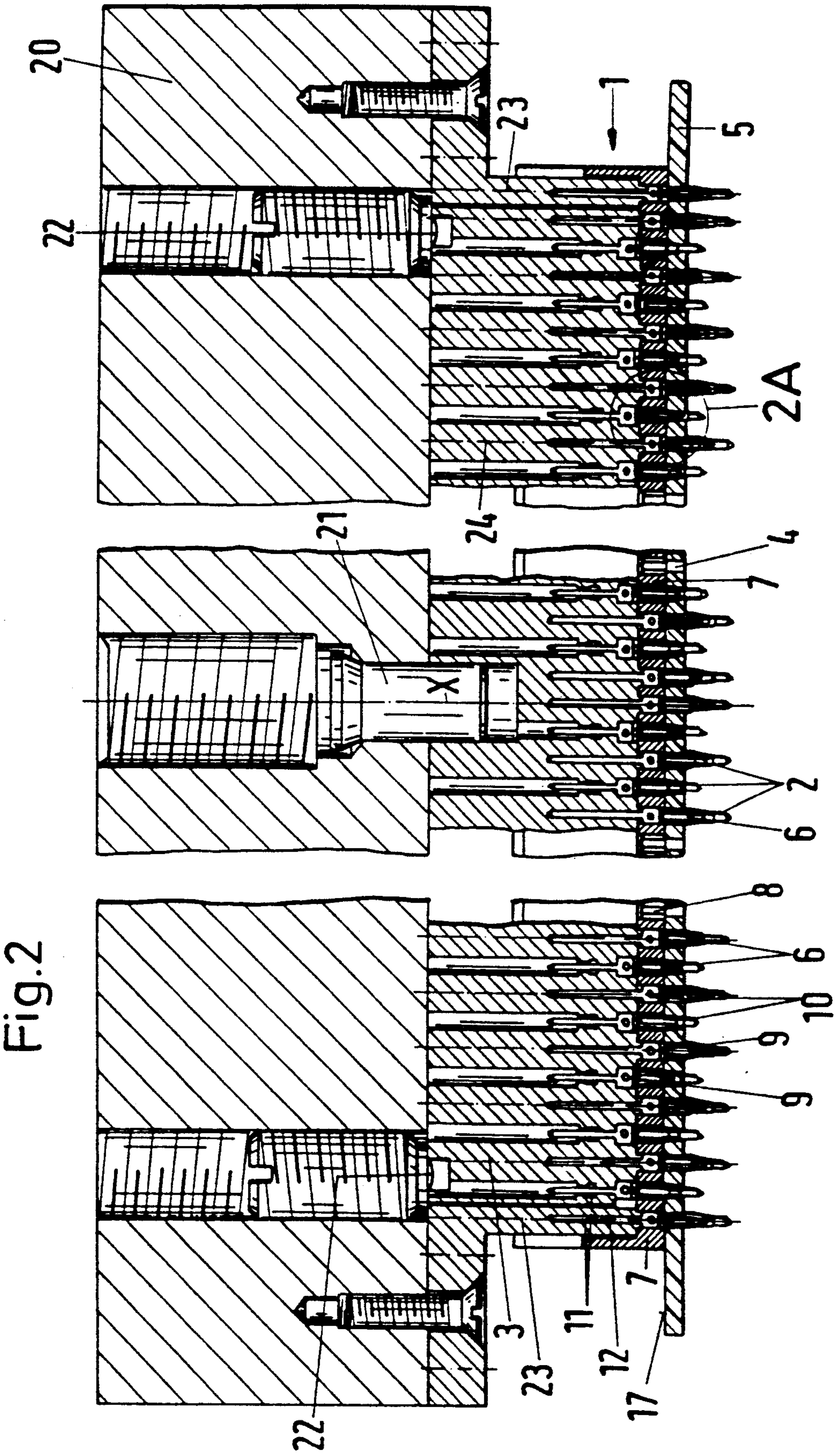
FIG. 2 is an enlarged cross-sectional view of the tool of FIG. 1 during the pressing-in process.
Figure 2A:
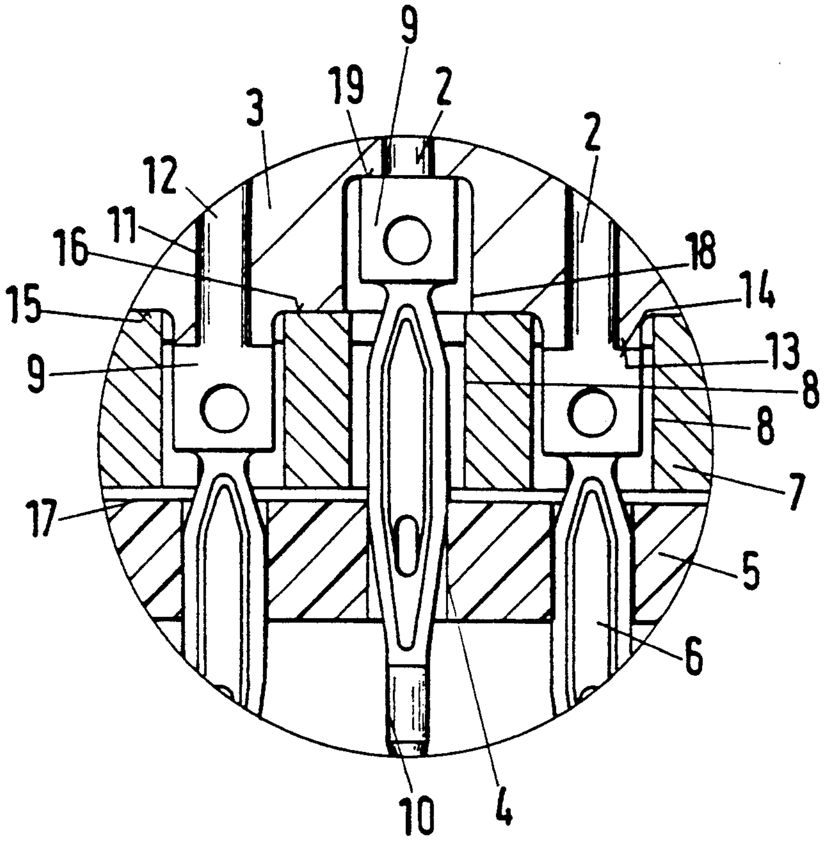
FIG. 2A is an enlarged portion of the cross-sectional view of FIG. 2.

Referring to the drawings in detail, and initially to FIG. 1, a plug-in connector 1 has contact elements 2 which can be pressed into the boreholes 4 of a printed circuit board 5 with the aid of a tool 3 according to the present invention. FIG. 2 shows the pressing-in tool 3 used in connection with plug-in connector 1 and printed circuit board 5 after the first step of the pressing-in process has been carried out, while FIG. 2A shows an enlarged sectional view for illustrating further details of tool 3. Plug-in connector 1 shown in FIGS. 1, 2 and 2A has an insulator 7 provided with recesses 8 which form appropriately constructed guides that prevent sideways tilting of contact elements 2.

Contact elements 2 are each provided with a press-fit section 6 and a holding section 9. An insulator 7 is provided into which contact elements 2 are pushed into and inserted therein. Insulator 7 includes recesses 8 for accommodating holding sections 9 of contact elements 2. Contact elements 2 are pushed thereinto and held therein by friction. Contact elements 2 are arranged in columns and rows, the grid of this arrangement corresponding to the grid R of boreholes 4 of printed circuit board 5, into which the ends of the contact elements 2 are to be pressed.

The front end of each contact element 2 is provided with a short insertion end 10, which precedes the press-fit section 6 and has a cross-sectional area which is smaller than that of press-fit section 6. To press contact elements 2 into boreholes 4 of printed circuit board 5, plug-in connector 1 having premounted contact elements 2 is placed on printed circuit board 5 in such a manner that ends 10 of contact elements protrude into printed circuit board 5. Subsequently, pressing-in tool 3 is pushed onto the contact elements 2 to press the same in.

For this purpose, tool 3 is provided with recesses 11, which are disposed in correspondence with the grid of contact elements 2 and into which upper ends 12 of contact elements 2 dip when tool 3 is set down. In the representation of FIG. 1, tool 3 is provided with pressing-in shoulders 13 for each first, third, fifth, etc. column of contact elements 2, counting from the left. When tool 3 is placed on contact elements 2, these pressing-in shoulders 13 press on upper shoulders 14 of holding sections 9, and when tool 3 is pressed downwards, press these contact elements 2 with their press-fit sections 6 into boreholes 4 of printed circuit board 5. Further, shoulders 15 on pressing-in tool 3 press, at the same time, against bottom 16 of insulator 7, thereby pressing insulator 7 against the upper surface 17 of printed circuit board 5.

In the contact element positions of the other columns of tool 3, that is, in each second, fourth, sixth, etc. column, enlarged recesses 18 are provided in tool 3. These recesses 18 are sufficiently large, so that holding sections 9 of contact elements 2 of these columns can dip into recesses 18 when tool 3 is depressed.

As mentioned above, contact elements 2 of each first, third, fifth, etc. column are pressed into boreholes 4 of printed circuit board 5 during the first pressing-in step and, at the same time, insulator 7 is pressed against printed circuit board 5. In so doing, no pressing-in pressure is exerted on contact elements 2 of the second, fourth, sixth, etc. column. Instead, their press-fit sections 6 are supported at the edges of boreholes 4 of printed circuit board 5, so that holding sections 9 of these contact elements 2 are shifted into recesses 8 of insulator 7 when insulator 7 is pressed down, and then pushed into enlarged recesses 18 of tool 3.

The depth of recesses 18 is limited by a stop shoulder 19. Towards the end of the pressing-in stroke, upper shoulders 14 of holding sections 9 come to a stop at stop shoulders 19, so that the pressing-in force is now exerted on contact elements 2 positioned there, and the front regions 10 of press-fit sections 6 are forced a small way into boreholes 4, of printed circuit board 5. This measure is provided so that the contact elements 2, which are not pressed completely into boreholes 4 in this step, are held slightly in boreholes 4 of printed circuit board 5 and cannot tilt away when tool 3 is removed.

Subsequently, tool 3 is removed from plug-in connector 1, and a second tool 3 is placed on plug-in connector 1. Second tool 3 is constructed like the first tool 3, with the exception that the recesses of the first, third, fifth, etc. columns of the contact element positions are exchanged here for those of the second, fourth, sixth, etc. columns, so that pressing-in shoulders 13 now engage shoulders 14 of holding sections 9 of the contact elements 2 that have not yet been pressed in. When tool 3 is depressed now, holding sections 9 are pushed into recesses 8 of insulator 7, and press-fit sections 6 of these contact elements 2 are at the same time pushed into boreholes 4 of printed circuit board 5.

After this second step has been carried out, all contact elements 2 of plug-in connector 1 have been pressed in.

Optionally, provisions can be made so that contact elements 2 are pressed into boreholes 4 in more than two steps. For this purpose, more pressing-in tools 3 are then provided, a portion of contact elements 2 being pressed in during each step, that is,.during the pressing-in stroke.

However, contact elements 2 are preferably pressed in during two steps, and preferably by the same tool 3. For example, tool 3 can be mounted on a carrier 20 and swivelled about a bearing 21 by 180° about the X-axis. Bearing 21 is disposed with respect to recesses 11 and 18 in tool 3 so that after tool 3 is swivelled through 180°, the contact elements 2 which were pressed in during the first step, correspond to enlarged recesses 18, and the contact elements 2, which were not pressed in, are in positions in which press-in shoulders 13 of tool 3 reach shoulders 14 of holding section 9 of these contact elements and press these contact elements 2 into printed circuit board 5 with tool 3 being pressed down. Locking means 22, such as ball notches, are provided on carrier 20 or on tool 3 for fixing the two working positions on the tool.

For a plug-in connector 1 which has an insulator 7 that is asymmetric with respect to the rotation of tool 3, provisions are preferably made so that two end pieces 23, which press in the outer columns of the contact elements 2, are rigidly mounted on carrier 20, and so that only the central portion 24 of tool 3 can be rotated about 180°.

To carry out the two steps, that is, the two pressing-in strokes, provisions can also be made so that a first half of the contact elements 2 are pressed in to begin with during the first step. Then, before the second step is carried out, tool 3 is shifted laterally on support 20 by an amount of the column grid, as indicated by the arrow in parentheses in FIG. 1.

Figure 4:
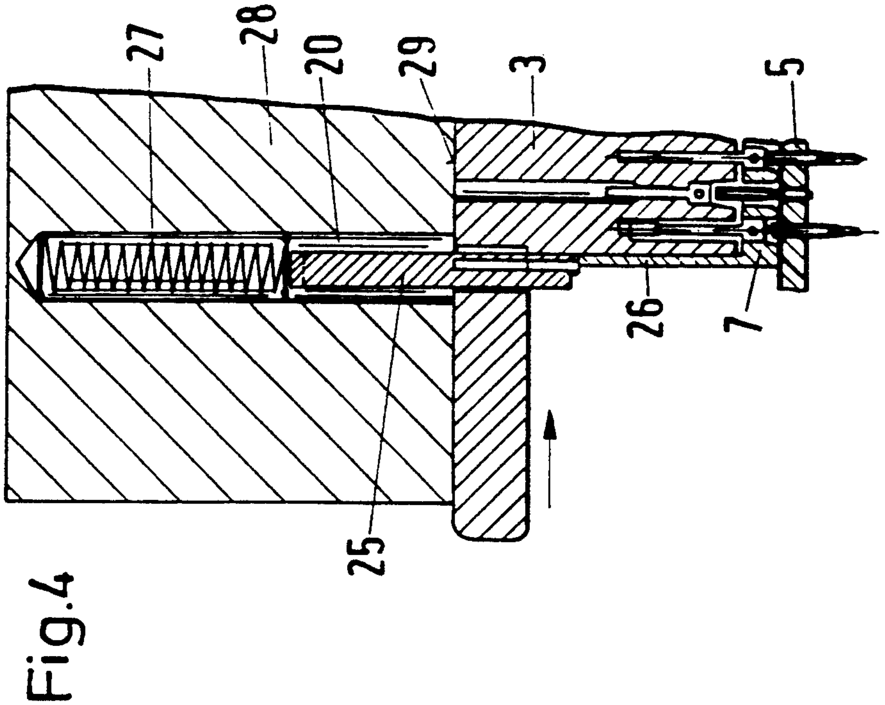
FIG. 4 is a cross-sectional view of the portion of the modified tool of FIG. 3, shown in a second step of operation.
Figure 3:
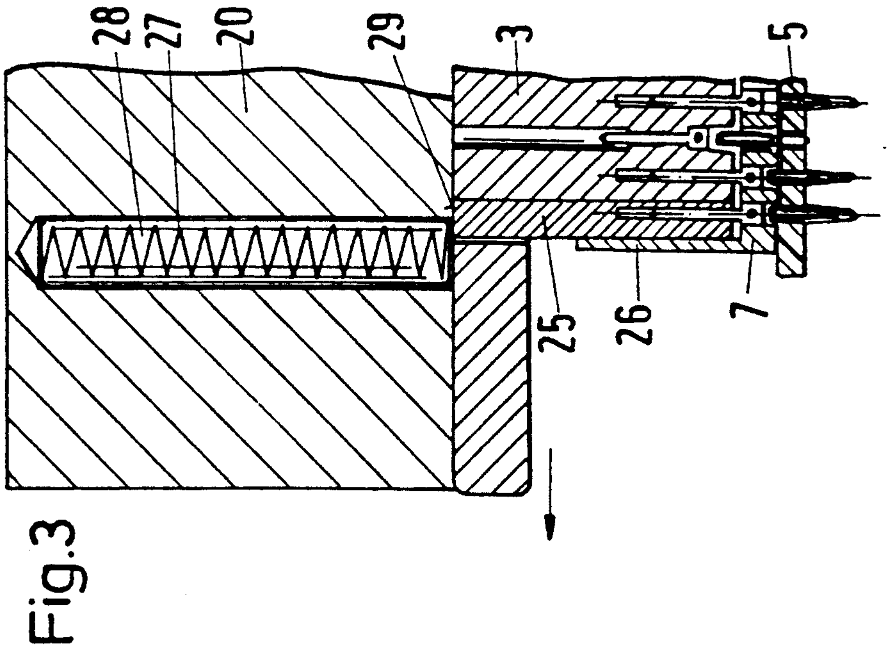
FIG. 3 is a cross-sectional view of a portion of a modified tool according to another embodiment of the present invention, shown in a first step of operation.

In FIGS. 3 and 4, the end piece 25 of a modified tool 3 is shown, which is provided for plug-in connectors 1 which have an insulator 7 with a collar 26 around insulator 7. During a second step, as shown in FIG. 4, when tool 3 is shifted laterally, end piece 25 of tool 3 would be set down on collar 26 of insulator 7, and break collar 26 when contact elements 2 are pushed into such a plug-in connector 1. In the modified tool 3, provisions are made so that end piece 25 of tool 3, which strikes insulator 7 during the second step, can slide back against the force of a spring 27 in a direction opposite to the pressing-in direction into a recess 28 of tool 3 or carrier 20.

During the first step, which is shown in FIG. 3, end piece 25 is prevented from escaping out of the way of bottom 29 of the support or carrier 20, and presses on the contact elements when it strikes them.

In the second step, which is shown in FIG. 4, after tool 3 is shifted sideways, end piece 25 reaches a position below spring 27 and recess 28 of carrier 20, and when it strikes collar 26 of insulator 7, slides back into recess 28.

Having described specific preferred embodiments of the invention with reference to the accompanying drawings, it will be appreciated that the present invention is not limited to those precise embodiments and that various changes and modifications can be effected therein by one of ordinary skill in the art without departing from the scope or spirit of the invention as defined by the appended claims.

What is claimed is:

1. A method for pressing press-fit sections of contact elements of a multipolar plug-in connector into boreholes of a printed circuit board, with the contact elements being positioned in rows and columns in a carrier of insulating material of the plug-in connector and held initially in recesses in the carrier by means of frictional resistance, comprising the steps of:

a) pressing a first set of the contact elements by means of a comb-like tool into respective boreholes of the printed circuit board such that:
   i) the pressing-in force of the tool is transferred by shoulders on the tool to shoulders on the contact elements of the first set,
   ii) the carrier of the plug-in connector is pressed against an upper surface of the printed circuit board, and
   iii) press-fit sections of a second set of contact elements which are not acted upon by the pressing-in force, are moved only slightly into an upper region of the boreholes of the printed circuit board and extend into said recesses of the carrier; and b) subsequently pressing at least some of the contact elements of the second set by means of a comb-like tool into other boreholes of the printed circuit board such that:
   i) said at least some of the contact elements of the second set are pushed through the recesses of the carrier, and ii) press-fit sections of said at least some of the contact elements of the second set are forced at the same time into respective boreholes of the printed circuit board.

2. The method of claim 1, wherein the same comb-like tool is used for both of said pressing steps.

3. The method of claim 2, further including a step of moving said tool between said first step of pressing and said subsequent step of pressing.

4. The method of claim 3, wherein said step of moving includes a step of laterally moving said tool between said first step of pressing and said subsequent step of pressing.

5. The method of claim 3, wherein said step of moving includes a step of rotating said tool between said first step of pressing and said subsequent step of pressing.

6. The method of claim 5, further including a step of releasably locking said tool in a first rotatable position during said first step of pressing and a second rotatable position during said subsequent step of pressing.

7. The method of claim 5, wherein said step of rotating includes a step of rotating said tool to a first rotatable position during said first step of pressing and a second rotatable position rotatably offset from said first rotatable position by approximately 180° during said subsequent step of pressing.

8. The method of claim 1, wherein, during said first step of pressing, upper holding sections of the second set of contact elements which are not acted upon by the pressing-in force, extend into recesses of said tool positioned above said recesses of the carrier.

9. A tool for pressing press-fit sections of contact elements of a multipolar plug-in connector into boreholes of a printed circuit board, with the contact elements being positioned in rows and columns in a carrier of insulating material and held initially in recesses in the carrier by means of frictional resistance, the tool comprising:

a comb-shaped block having:
   a plurality of recess means formed in said block for accommodating upper ends of the contact elements, said plurality of recess means being provided at positions where contact elements which are not to be pressed into the boreholes are present, such that said plurality of recess means receive holding sections of these contact elements during pressing-in of other said contact elements into said boreholes of said printed circuit board,
   first shoulder means formed in said block for transferring a pressing-in force to corresponding shoulders of the other contact elements to move said other contact elements in a pressing-in direction, said first shoulder means being displaced from said plurality of recess means in a lateral direction of said block, and
   second shoulder means formed in said block for pressing the carrier of the plug-in connector down onto an upper surface of the printed circuit board, said second shoulder means being adjacent to, in the lateral direction of said block, at least one of:
   said plurality of recess means and
   said first shoulder means.

10. The tool of claim 9, wherein each of said recess means is bounded at an upper end thereof by a third shoulder means for limiting movement of the holding section of a contact element pushed thereinto, said third shoulder means being positioned at such a distance from an underside of the tool that, during the pressing-in of the other contact elements, only a front region of the press-fit section of the contact element therein is pressed into a borehole of the printed circuit board.

11. The tool of claim 9, wherein said recesses of the carrier include guides through which the other contact elements are pushed into during the pressing-in process, said guides being constructed to hold said other contact elements to prevent any sideways tilting thereof.

12. The tool of claim 9, wherein said plurality of recess means are provided in the tool for each second row of contact elements.

13. The tool of claim 9, further including carrier means for movably holding said tool, said carrier means being connected with an upper end of said block.

14. The tool of claim 13, wherein said carrier means rotatably holds the tool and applies a pressing force on said tool to cause said tool to apply a pressing-in stroke on said multipolar plug-in connector, said carrier means including bearing means connected substantially centrally to said block for permitting rotation of the tool by approximately 180° so as to cause said other contact elements which were pressed into the boreholes of the printed circuit board during a first pressing-in stroke, to be positioned in alignment with said recess means of the tool, after rotation thereof, during a second pressing-in stroke, the first-mentioned contact elements being pressed into the boreholes of the printed circuit board during said second pressing-in stroke.

15. The tool of claim 14, further including locking means provided between and in contact with both the carrier means and the block in order to fix the tool in the two operating positions.

16. The tool of claim 14, further including fixed end piece means, mounted to the carrier means and being formed at opposite sides of the rotatable block, for pressing-in the contact elements of outer columns of the plug-in connector.

17. The tool of claim 9, wherein said plug-in connector includes a housing edge, and said tool further includes movable end region means for pressing-in contact elements of the plug-in connector in a pressing-in direction when said movable end region means is in alignment therewith and for moving in a direction away from said pressing-in direction when said movable end region means is in alignment with and abuts against said housing edge, said movable end region means being movable positioned at a side of said block.

18. The tool of claim 17, further including carrier means for movably holding said tool, said carrier means including a recess for receiving said movable end region means in a first position of said tool when said movable end region means is in alignment with and abuts against said housing edge during a pressing-in operation, said recess being out of alignment with said movable end region means in a second position of the tool.

19. The tool of claim 18, wherein said carrier means further includes spring means positioned in said recess thereof for applying a force on said movable end region means in said pressing-in direction when the movable end region means is forced into said recess.

* * * * *